United States Patent [19]

Josephs et al.

[11] Patent Number: 4,459,823

[45] Date of Patent: Jul. 17, 1984

[54] ROTATING LIQUID NITROGEN COOLED SUBSTRATE HOLDER

[75] Inventors: Richard M. Josephs, Willow Grove; Ronald A. Flowers; Peter L. Young, both of North Wales, all of Pa.

[73] Assignee: Sperry Corporation, New York, N.Y.

[21] Appl. No.: 480,522

[22] Filed: Mar. 30, 1983

[51] Int. Cl.³ ............................................. F25B 19/00
[52] U.S. Cl. ...................................... 62/268; 62/381; 62/383; 62/514 R
[58] Field of Search ...................... 62/383, 514 R, 100, 62/268, 381

[56] References Cited

U.S. PATENT DOCUMENTS

| | | | |
|---|---|---|---|
| 2,803,888 | 8/1957 | Cerletti | 62/100 |
| 3,195,620 | 7/1965 | Steinhardt, Jr. | 62/514 R |
| 4,306,425 | 12/1981 | Sitte et al. | 62/514 R |
| 4,388,814 | 6/1983 | Schilling | 62/514 R |

Primary Examiner—Ronald C. Capossela
Attorney, Agent, or Firm—John B. Sowell; Thomas J. Scott; Marshall M. Truex

[57] ABSTRACT

An apparatus comprising a rotating substrate holder is provided. The rotating substrate holder is hollow and adapted to receive liquid gas such as nitrogen to cool the substrate to cryogenic temperatures. The novel substrate holder is supported inside of a vacuum chamber by a thin wall tube which is sealed with a liquid rotating seal at the point where it passes completely through the top wall of the vacuum chamber. The novel thin wall tube support provides access to the hollow substrate holder from outside the vacuum chamber and provides temperature isolation of the liquid in the substrate holder so that the liquid rotating seals are maintained at operable elevated temperatures.

9 Claims, 2 Drawing Figures

ROTATING LIQUID NITROGEN COOLED SUBSTRATE HOLDER

BACKGROUND OF THE INVENTION

1. Field of the Invention

This invention relates to an apparatus for the vacuum deposition of thin films on a substrate in a high vacuum chamber. More particularly, the present invention relates to the provision of a rotatable work station or holder which is located inside of a high vacuum chamber where the temperature of the work station or holder is held at the temperature of liquid gases such as nitrogen.

2. Description of the Prior Art

Vacuum deposition of metals at high vacuums is employed in the semiconductor art to provide thin films and thin layers of metals in predetermined pattern configurations as a step or steps in the production of semiconductor devices such as metal oxide silicon devices, bipolar devices and Josephson junction devices, etc. The process of depositing the thin films includes thermal deposition of metals in which the metals being deposited are thermally evaporated from a boat or source. Other methods of depositing thin films which are well known include electron beam evaporation and sputtering. One of the problems that arises in depositing thin films using the above-mentioned processes is that the atoms of material are deposited in a line of sight or straight line mode of operation. It is well known that only small wafers can be made in the average size vacuum chamber without creating edge coverage configuration problems because the angle of incidence of the portion of the wafer which is not orthogonal to the source of material being deposited creates an edge shadow or overshoot. In order to overcome the prior art edge deposit problems, it was known that the substrate could be mounted on a revolving work station. Material was deposited at an oblique angle and the substrate on the work station was rotated so that all edges of the individual devices or patterns are subject to line of sight deposition which exposes the edges of the individual patterns to the material being deposited.

A second problem arises when the rotating substrate must be heated or cooled. It is possible to heat the work station or substrate holder with electrical means inside of a vacuum chamber using well known techniques. However, when it is necessary to cool a substrate in a high vacuum, the liquid cooling lines must be coupled to the work holder. When liquid gases such as nitrogen are employed to produce cryogenic temperatures below 100° Kelvin, this becomes difficult because of problems such as freezing of the rotating seals and leakage of the coolant lines at the interface between the stationary conduits and the rotating work holder.

Heretofore, rotatable work stations have been manufactured which will operate in a vacuum chamber. Such prior art rotating work stations provided a motor or drive mechanism which had a shaft extending through the top wall of the vacuum chamber. The work station was coupled to or mounted on the electrical motor shaft inside of the vacuum chamber to provide the necessary rotation of the work station. There is no simple way to cool such a rotating work station even though it can be heated electrically by rather simple means. It is possible to provide electrically conductive commutator rings on the rotating work station apparatus so that electrical resistance heaters can be used inside of a vacuum chamber. However, cooling requires that the liquid gas cooling fluid be passed through a fluid coupling which may become inoperative or leak when attempts to rotate the substrate are made.

It would be desirable to produce thin films on large wafers or substrates and to mount such wafers and substrates on a rotating work station which is capable of providing temperatures below 100° Kelvin. This would permit large scale production of devices such as Josephson junction devices and low temperature deposition of materials for other thin film devices.

SUMMARY OF THE INVENTION

It is a principal object of the present invention to provide a rotatable work holder or work station in a high vacuum environment where the work station is being held at cryogenic temperatures below 100° Kelvin.

It is another principal object of the present invention to provide a novel high vacuum apparatus for depositing thin films on large wafers or substrates in a uniform manner in a high vacuum chamber at cryogenic temperatures below 100° Kelvin.

It is yet another object of the present invention to provide novel high vacuum deposited apparatus which is provided with a rotary vacuum seal that is adjacent to the high vacuum chamber but is removed from the effect of a cryogenic temperature work holder.

It is yet another object of the present invention to provide a novel work station which is connected to the end of a hollow thin wall metal tube which can be inserted through the top wall of a high vacuum chamber so that liquid nitrogen can be placed in the hollow chamber of the work station inside the high vacuum chamber from a position outside of the vacuum chamber.

It is a general object of the present invention to provide a pair of coaxially mounted thin wall metal tubes for supporting a novel work station inside of a high vacuum chamber at cryogenic temperatures.

According to these and other objects of the present invention, there is provided a vacuum chamber having an aperture in the top wall of the chamber. A closure is mounted over the aperture and the closure includes magnetic means cooperating with a plurality of ferrofluids sealed intermediate the magnets in the closure and a thin wall hollow tube mounted through the center of the closure. The thin wall hollow tube supports a work station which comprises a hollow chamber adapted to receive cold liquified gas at cryogenic temperatures therein.

DESCRIPTION OF THE PREFERRED EMBODIMENT

The term cryogenic temperature as employed in this application shall mean a temperature around 100° Kelvin or below at which thin films are deposited during the process of making devices such as Josephson junction devices.

The process for depositing thin films at cryogenic temperatures includes the steps of thermal deposition which is a thermal evaporation and deposition technique wherein the metal to be deposited is melted or vaporized so as to create a cloud of atoms which are deposited in a line of sight deposition mode. Electron beam deposition is similar to thermal evaporation and deposition in that the metal to be deposited is melted or vaporized by means of an electron beam and the material which is vaporized is also deposited in a line of sight deposition mode. The present invention may be employed when the process of depositing the thin film includes sputtering. When a sputtering process is employed, the atoms of the material to be deposited are ejected from the target material by ion bombardment to create a cloud of free atoms of the material which is deposited isotropically as it condenses over the substrate on the work station.

Figure 1:
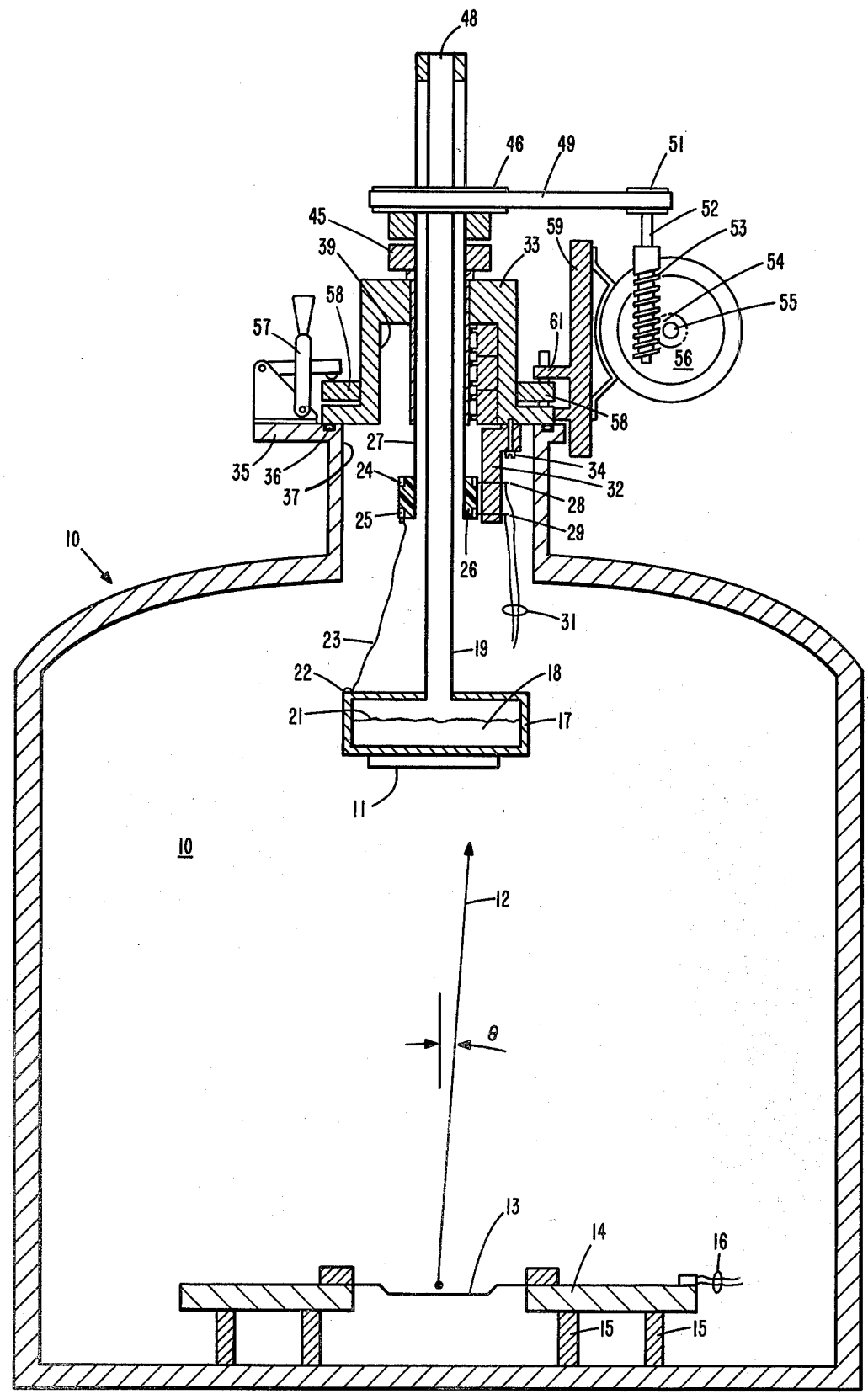
FIG. 1 is a cross-section in elevation taken through a high vacuum chamber and showing a heated boat located opposite a substrate on a rotatable work holder which is held at cryogenic temperatures.

Refer now to FIG. 1 which is a schematic drawing of a vacuum chamber and is not drawn to scale. The vacuum chamber 10 may be several feet high and several feet in diameter. The substrate 11 which is being processed in the high vacuum chamber 10 may be from one to five inches in diameter. When the size of the wafers 11 begin to create an angle of incidence theta which exceeds 6°, there are problems of non uniform edge coverage of the patterns being covered by the thin films being deposited. Such problems are well known in this art and do not require further explanation. In the FIG. 1, there is shown a boat 13 which supports and contains the material M to be deposited. The edge of the metal conductive boat 13 is shown attached to a copper conductive bus bar 14 which serves to support the boat 13. The bus bars 14 are insulated from the sidewall of the vacuum chamber by insulation supports 15. Bus bars 14 are connected to an electrical terminal 16 which leads outside of the vacuum chamber 10. When the material M is heated to a sufficiently high temperature, atoms of the material evaporate and traverse the distance between the work station 13 and the substrate 11 on a line of sight 12 as discussed hereinbefore.

The substrate or wafer 11 is supported by conventional means such as adhesive on a work station 17 which comprises a hollow chamber 18 connected to a thin wall hollow metal tube 19. The thin wall metal tube 19 is preferably made from type 304 stainless steel and is brazed to the hollow work station 17 which is preferably made from an oxygen free high conductivity copper milled from a block to any desired shape. Line 21 represents the level of liquid nitrogen which may be maintained in the hollow chamber 18 of the work station 17 to maintain the wafer or substrate 11 attached thereto at the aforementioned cryogenic temperatures. Depending on the level 21 of liquid nitrogen maintained in the work station 17, the surface of the substrate 11 may be held at a desired temperature within a range of temperatures below 100° Kelvin. A thermocouple 22 is buried in the copper block of the work station 17 so as to accurately monitor the temperature of the conductive work station 17. Experience with measurements of the temperature of the work station 17 have shown very close correlation with the actual surface temperature of the wafer or substrate 11. An electrical lead 23 is connected to the thermocouple 22 and the wires of lead 23 are connected to commutator rings 24 and 25 mounted on an insulating annular ring 26 which is connected to the bottom of outer thin wall tube 27. Brushes 28 and 29 are resiliently urged in contact with the commutator rings 24 and 25 to provide electrical thermocouple 22 signals on line 31. Line 31 is shown terminated inside of the vacuum chamber 10 but the wires are lead to the outside of the vacuum chamber in a well known manner. Brushes 28 and 29 are mounted on a downward depending support 32 which provides means for supporting and holding the electrically conductive brushes. The support 32 may be mounted on the annular flange shaped closure 33 by means of screw 34 or may be supported from a sidewall of the vacuum chamber 10. The closure 33 is shown mounted on a flanged outlet 35 of the vacuum chamber 10. A seal such as an O-ring 36 is provided to form a high vacuum seal at the outlet or aperture 37 of the vacuum chamber 10.

Figure 2:
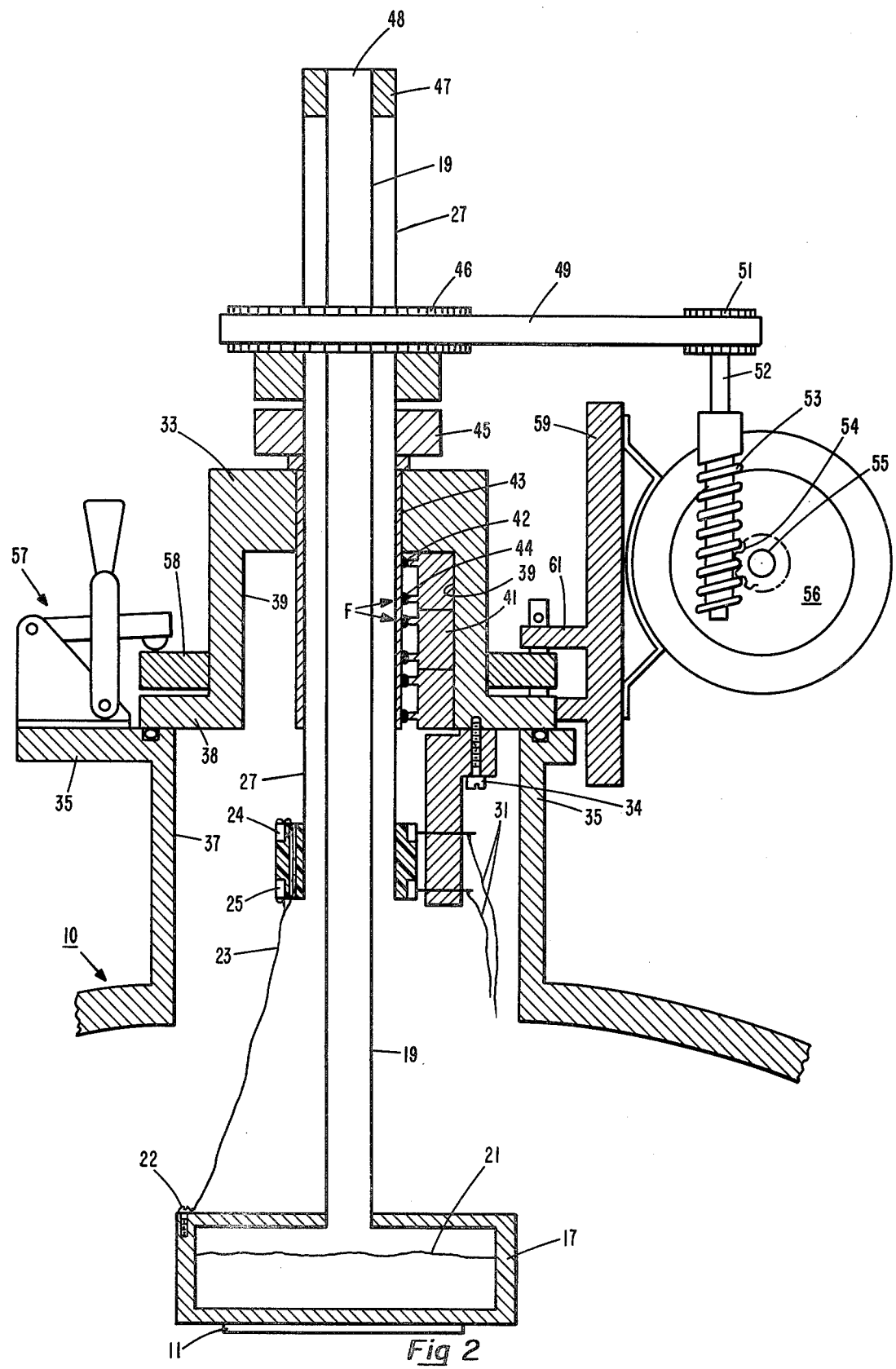
FIG. 2 is an enlarged partial cross-section of the top wall of the high vacuum chamber showing details of the novel rotatable work station support which extends into the high vacuum chamber and has means for applying cryogenic cold liquid gases which extends through the top wall of the vacuum chamber into the atmosphere.

Refer now to FIGS. 1 and 2 for the details of the novel support apparatus which comprises the closure 33 mounted on flange 35 of the vacuum chamber 10. The diameter of the work station 17 is smaller than the opening or aperture 37 in the vacuum chamber 10. The lower flange 38 of the closure 33 seals against the flanged outlet 35 of vacuum chamber 10. A recess 39 is provided in the closure 33 and a plurality of permanent magnets 41 are mounted therein. The magnets 41 are provided with radially extending inner annular rings 42 which have their inner diameter juxtaposed and separated from precision sleeve 43. Precision sleeve 43 is fixed onto and sealed to outer thin wall hollow metal tube 27. It will be understood that the precision sleeve 43 may be eliminated if the outer thin wall hollow metal tube is ground to precision dimensions which permit it to provide the proper spacing between its outer surface and the face of the inner annular ring 42. The spaces 44 between the rings 42 and the outer diameter of the precision sleeve 43 are filled with a ferro-fluid seal F which is maintained at the tips or inner surface of the inner annular rings 42 by the magnetic field created by the permanent magnets 41. Such ferro-fluid and ferro-fluid seals are commercially available and are generally employed in high vacuum atmospheres where high integrity vacuum seals are required.

The outer thin wall hollow metal tube 27 is supported on closure 33 by thrust bearing 45 so that the ferro-fluid material in the space 44 maintains a high integrity seal when tube 27 is rotated by pulley 46 attached to tube 27. The upper end of the outer thin wall hollow metal tube 27 is shown connected to an insulating annular ring 47 which also connects to the inner thin wall hollow metal tube 19. The opening 48 in the thin wall hollow metal tube 19 provides an access for pouring or inserting liquid nitrogen into the hollow work station or work holder 17. As discussed hereinbefore, the level of nitrogen 21 is established to maintain a predetermined desired temperature. The level of nitrogen 21 once established in the work holder 17 evaporates very slowly and will maintain a constant temperature for the time required for the thin film deposition to take place. Experience has shown that the level of nitrogen in the novel work holder 17 can be maintained for up to several hours even though the time for deposition of the thin film only requires a few minutes.

To explain the novel mode of operation of the present apparatus, it should be understood that the temperature of the work holder 17 will be substantially uniform and that the substrate 11 is held at approximately the same temperature. In the preferred embodiment, a hollow thin wall metal tube having very low thermal conductivity is attached to the hollow work holder 17. Type 304 stainless steel having a ten mil thickness has been found to provide very low thermal conductivity, which provides a thermal gradient and thermal barrier between the holder 17 and its ferro-fluid seals in the gap or space 44. Even though the surface of the work holder 17 is at cryogenic temperature, the high vacuum environment inside of the vacuum chamber 10 serves as a thermal insulator in a manner similar to a vacuum bottle. The upper end of the inner thin wall metal tube 27 is preferably at room temperature, but may be heated to provide a higher temperature external environment so that the temperature gradient between the outside environment and the work holder 17 is even greater. It has not been found necessary to heat the outer end of either of the tubes 19 and 27 to maintain the ferro-fluid seals liquid under high vacuum and cryogenic temperatures in the work station 17.

Cogged pulley 46 is fixed to the outside of tube 27 and is driven by flexible belt 49 which is connected to a smaller cogged pulley 51 mounted on shaft 52 of the gear reduction worm drive 53. Worm drive 53 is driven by the gear 54 mounted on shaft 55 of motor 56. It is desirable to drive the work station 17 at a low rotational rate which may be in the range of ten RPM, accordingly, a gear reduction drive and a standard RPM motor are most appropriate.

In the preferred embodiment, the flanged shape closure 33 is positioned on top of flanged outlet 35 and is clamped by appropriate clamping means 57 to apply pressure to a resilient annular ring 58. In the preferred embodiment, a motor mount 59 having a flange 61 is shown bearing on resilient O-ring 58. It will be understood that additional clamps or clamping means similar to clamp 57 will be employed to urge flange 61 against resilient O-ring 58 so as to form a seal between flange shape closure and flange 35.

Other forms of top covers for vacuum chambers are employed in this art and may be substituted for the bell closure shown. For example, vacuum chambers often employ cylindrical sidewalls and flat top plates in which apertures are cut to accommodate equipment that is suspended in the center of the vacuum chambers 10.

Having explained a preferred embodiment rotating seal which will maintain its integrity in a high vacuum environment, it will be understood that other shapes and types of work stations 17 may be suspended in the vacuum chamber 10 by means of thin wall hollow metal tubes of the type shown and described in FIGS. 1 and 2.

It will be understood by those skilled in the art of depositing thin films and high vacuum that the system shown can be used in a sputter up configuration. Further, the novel system may be used for dry etching apparatus such as plasma etchers, reactive ion etchers and ion millers where the material is being removed rather than deposited as explained hereinbefore. Other modifications and improvements may be embodied into the highly simplified system shown and described in the present application without departing from the basic structure and mode of operation.

We claim:

1. Apparatus for rotating a substrate in a vacuum chamber at cryogenic temperatures, comprising:
    a vacuum chamber,
    a top on said vacuum chamber,
    an aperture in said top of said vacuum chamber,
    a closure mounted on said aperture of said top of said vacuum chamber,
    magnetic means fixed in a recess in said closure,
    said magnetic means comprising a plurality of annular shaped magnets,
    a thin wall hollow metal tube mounted through the center of said magnets for rotary movement relative thereto,
    ferro-fluid seal means intermediate said magnets and said thin wall hollow tube,
    a work station mounted on one end of said thin wall hollow tube and cooperating therewith,
    said work station comprising a hollow chamber adapted to receive cold-liquified gas at cryogenic temperatures therein,
    said work station having means for holding a work piece thereon in close proximity to said cold-liquified gas in said hollow chamber of said work station, and
    drive means coupled to said thin wall hollow tube for rotating said thin wall hollow tube and said work station while maintaining said work station hollow chamber below 100° Kelvin and said ferro-fluid seal above freezing temperature.

2. Apparatus as set forth in claim 1 wherein said thin wall hollow metal tube is extended beyond said drive means and is maintained at room temperature.

3. Apparatus as set forth in claim 1 wherein said thin wall hollow metal tube further includes an inner tube for supporting said work station,
    an outer tube cooperating with said ferro-fluid seal means, and
    means connecting said tubes at a point removed from said vacuum chamber in said drive means.

4. Apparatus as set forth in claim 3 which further includes an insulating ring mounted on said outer tube inside of said vacuum chamber,
    electrically conductive commutator rings mounted on said insulating ring,
    electrically conductive brushes cooperating with said commutator rings, and
    support means for supporting said electrically conductive brushes inside of said vacuum chamber.

5. Apparatus as set forth in claim 4 wherein said support means is coupled to the top of said vacuum chamber for providing fixed support to said electrically conductive brushes.

6. Apparatus as set forth in claim 4 which wherein said means connecting said tubes comprises a second insulating ring mounted between said inner tube and said outer tube outside of said vacuum chamber for providing insulation between said tubes.

7. Apparatus as set forth in claim 1 which further includes a thrust support bearing connected to said tube above said top of said vacuum chamber.

8. Apparatus as set forth in claim 7 wherein said thrust support bearing is mounted intermediate said top of said vacuum chamber and said drive means.

9. Apparatus as set forth in claim 1 wherein said drive means comprises an electric motor having a drive shaft,
    a first pulley coupled to said drive shaft of said electric motor.
    a second pulley fixed on said thin wall tube, and
    flexible belt means connecting said first and said second pulleys.

* * * * *